(12) United States Patent
Ceballos et al.

(10) Patent No.: US 12,368,421 B2
(45) Date of Patent: Jul. 22, 2025

(54) LOGARITHMIC AMPLIFIERS IN SILICON MICROPHONES

(71) Applicant: Infineon Technologies AG, Neubiberg (DE)

(72) Inventors: Jose Luis Ceballos, Villach (AT); Fulvio CiCiotti, Villach (AT); Dietmar Straeussnigg, Villach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 618 days.

(21) Appl. No.: 17/660,120

(22) Filed: Apr. 21, 2022

(65) Prior Publication Data

US 2023/0344398 A1 Oct. 26, 2023

(51) Int. Cl.
| | |
|---|---|
| *H03F 3/45* | (2006.01) |
| *H03F 3/00* | (2006.01) |
| *H03F 3/217* | (2006.01) |
| *H03G 3/00* | (2006.01) |
| *H03G 3/30* | (2006.01) |
| *H04R 3/00* | (2006.01) |

(52) U.S. Cl.
CPC .......... *H03G 3/3089* (2013.01); *H03F 3/005* (2013.01); *H03F 3/2175* (2013.01); *H03G 3/008* (2013.01); *H04R 3/00* (2013.01); *H03F 2200/03* (2013.01)

(58) Field of Classification Search
CPC .... H03F 3/005; H03F 3/2175; H03F 2200/03; H03F 3/45475; H03F 2200/42; H03F 2200/48; H03F 2203/45512; H03F 2203/7224; H03F 1/0277; H03F 3/72; H03G 3/3089; H03G 3/008; H03G 3/3031; H03G 3/32; H03G 7/001; H03M 1/186; H04R 19/04
USPC ........................................ 330/254
See application file for complete search history.

(56) References Cited

U.S. PATENT DOCUMENTS

| | | | |
|---|---|---|---|
| 5,805,011 A | 9/1998 | Comino | |
| 9,966,913 B2 | 5/2018 | Chan et al. | |
| 2003/0030479 A1* | 2/2003 | Holdenried | G06G 7/24 327/350 |

FOREIGN PATENT DOCUMENTS

CN 102932073 A * 2/2013 ............. H04B 17/00

OTHER PUBLICATIONS

Holdenried, Chris D. et al., "A DC-4-GHz True Logarithmic Amplifier: Theory and Implementation," IEEE Journal of Solid-State Circuits, vol. 37, No. 10, Oct. 1, 2002, pp. 1290-1299.

* cited by examiner

*Primary Examiner* — Andrea Lindgren Baltzell
*Assistant Examiner* — Khiem D Nguyen
(74) *Attorney, Agent, or Firm* — Slater Matsil, LLP

(57) ABSTRACT

A logarithmic amplifier includes programmable gain amplifiers each having a different gain, wherein an input of each of the programmable gain amplifiers is coupled to an input of the logarithmic amplifier; and a summing circuit having inputs coupled to a corresponding output of each of the programmable gain amplifiers and an output coupled to an output of the logarithmic amplifier, wherein the summing circuit generates a logarithmic transfer function having piecewise linear segments.

20 Claims, 11 Drawing Sheets

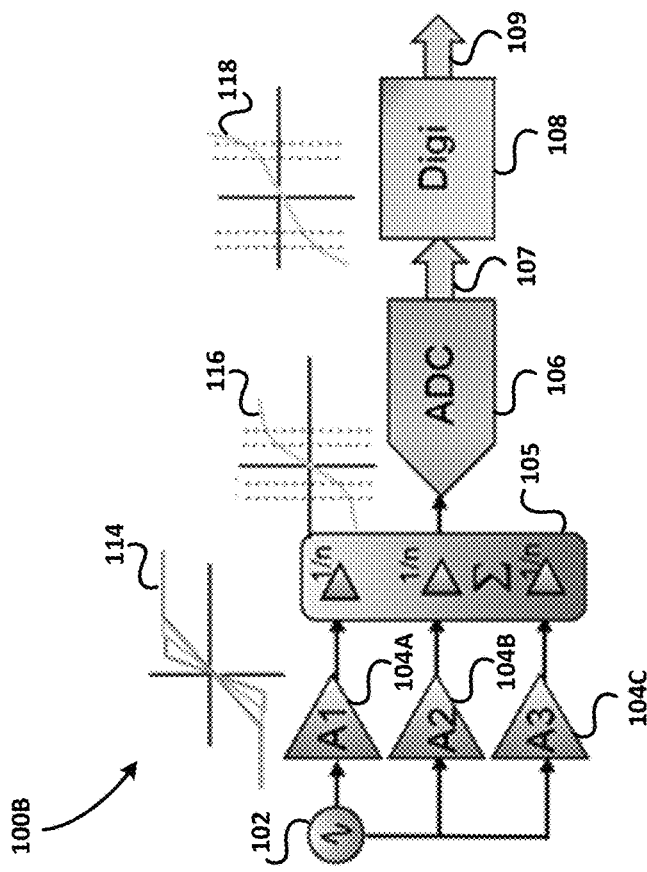
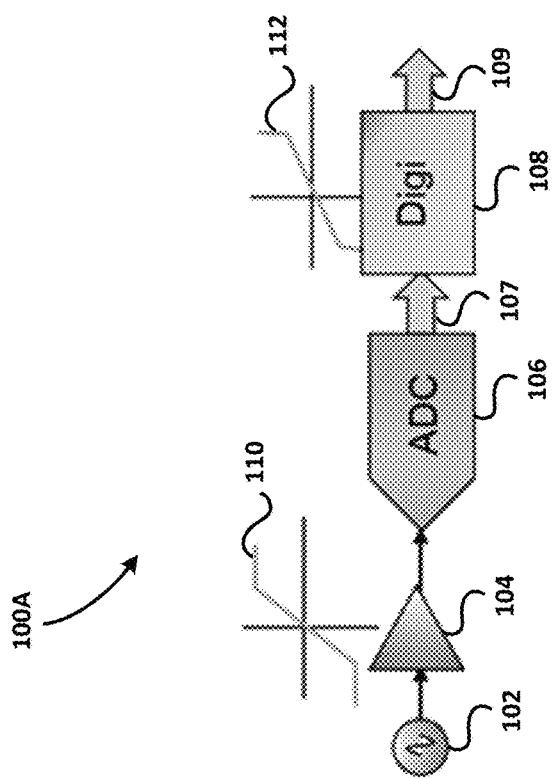
FIG. 1B
FIG. 1A

LOGARITHMIC AMPLIFIERS IN SILICON MICROPHONES

TECHNICAL FIELD

The present invention relates generally to logarithmic amplifiers in silicon microphones, and to a corresponding system and method.

BACKGROUND

Digital or silicon microphones are known in the art. Digital microphones generally include a microelectromechanical system (MEMS) device that is responsive to ambient sound waves, a programmable gain amplifier (PGA) for amplifying an analog signal generated by the MEMS device, an analog-to-digital converter (ADC) for converting the analog signal into a digital signal, and digital signal processing circuitry to provide a digital output signal that corresponds to the input analog signal in an format requested by a customer. While single-ended and differential PGA amplifiers for digital microphones are known, market trends compel the increasing use of low noise PGA amplifiers with improved signal-to-noise ratios (SNR), as well as the ability to handle wide signal swings from the MEMS device without degrading performance.

SUMMARY

According to an embodiment, a logarithmic amplifier includes a plurality of programmable gain amplifiers each having a different gain, wherein an input of each of the plurality of programmable gain amplifiers is coupled to an input of the logarithmic amplifier; and a summing circuit having a plurality of inputs coupled to a corresponding output of each of the plurality of programmable gain amplifiers and an output coupled to an output of the logarithmic amplifier, wherein the summing circuit is configured for generating a logarithmic transfer function having a plurality of piecewise linear segments.

According to an embodiment, a circuit includes a logarithmic amplifier comprising a plurality of programmable gain amplifiers, the logarithmic amplifier having an input for receiving an analog input voltage; an analog-to-digital converter ("ADC") having an input coupled to an output of the logarithmic amplifier; and a digital anti-logarithmic component coupled to an output of the ADC, wherein an output of the digital anti-logarithmic component provides a linearized digital signal corresponding to the analog input voltage.

According to an embodiment, a method includes amplifying an analog input signal in a plurality of parallel gain paths, wherein each of the parallel gain paths comprises a different gain value; generating a plurality of currents or charges from a plurality of output voltages of the parallel gain paths; and summing the plurality of currents or charges to provide a piecewise linear output voltage.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A is a block diagram of an exemplary logarithmic amplifier system comprising an analog programmable gain amplifier, an analog-to-digital converter (ADC), and a digital anti-logarithmic component;

FIG. 1B is a logarithmic amplifier system comprising a "quantized" analog logarithmic programmable gain amplifier (PGA) and summing circuit, an analog-to-digital converter (ADC), and a digital anti-logarithmic component, according to an embodiment;

DETAILED DESCRIPTION OF ILLUSTRATIVE EMBODIMENTS

Figure 2:
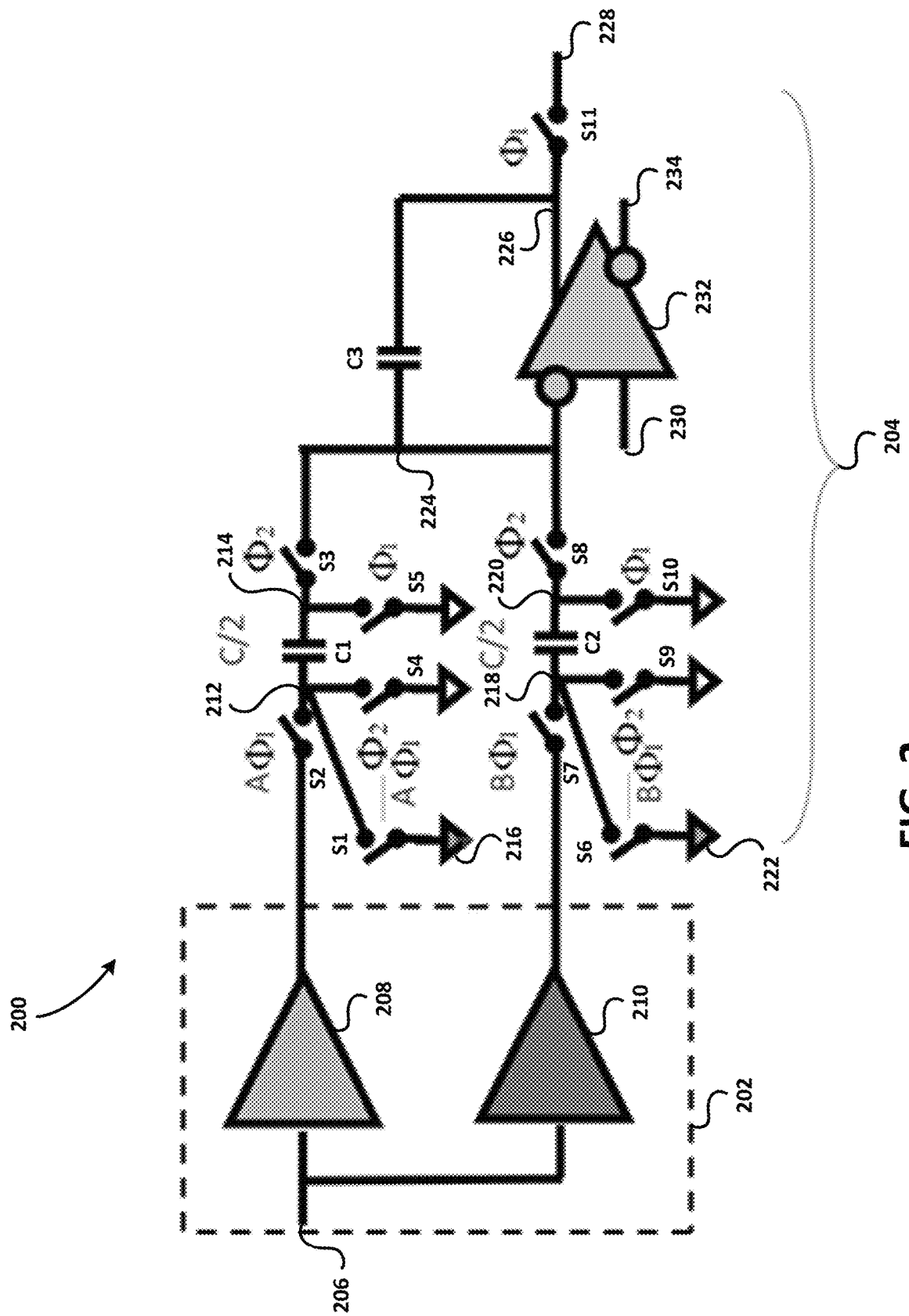
FIG. 2 is a schematic diagram of a switched capacitor circuit for implementing the quantized PGA and summing circuit shown in FIG. 1B, according to an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Silicon microphones should be able to accommodate large input signal swings and to have a high SNR. Large input signal swings can clip (saturate) the programmable gain amplifiers (PGA) driving the ADC, which will impact SNR by distorting the input signal. One way of handling this is by using a signal processing system including a logarithmic amplifier and an anti-logarithmic component (compression-decompression) implemented partially in the analog domain and implemented partially in the digital domain. In some such systems, a single logarithmic amplifier can be used for the programmable gain amplifier. According to embodiments, the programmable amplifier is split in two or more individual amplifiers each having different gains, each individual amplifier driving two or more inputs of a summing circuit. The summing circuit can comprise a switched capacitor circuit, or a continuous-time resistor circuit. Due to the nonlinear nature of the individual amplifiers, there will be a first clipping (saturating close to the rails) of a first amplifier and then, consecutively, the other individual amplifiers will saturate as the input signal increases in amplitude. The saturated individual amplifiers each deliver a full charge to its corresponding input of the summing circuit.

This "quantized" approach advantageously provides a signal processing system wherein only one offset (the average of each of the individual amplifiers) must be corrected, the anti-logarithmic digital signal processing can be simplified, a quasi-constant SNR can be maintained over the input signal range, and the SNR can be tailored while the total system area can be reduced. In some embodiments the ADC integrated circuit area can be reduced due to the use of smaller sampling capacitors.

FIG. 1A is a block diagram of an exemplary logarithmic amplifier system 100A comprising an analog programmable gain amplifier 104 for receiving an analog input signal 102 (which may be generated by a MEMS device, not shown in FIG. 1A), an analog-to-digital converter (ADC) 106, and a digital anti-logarithmic component 108. ADC 106 is coupled to the digital anti-logarithmic component 108 through digital bus 107. The digital anti-logarithmic component 108 comprises an output bus 109 that provides a linearized digital signal. The analog programmable gain amplifier 104 has a logarithmic transfer function 110 (due to the saturation of the amplifier), and the digital anti-logarithmic component 108 has an anti-logarithmic transfer function 112.

FIG. 1B is a logarithmic amplifier system 100B comprising a "quantized" analog logarithmic programmable gain amplifier (PGA) comprising individual amplifiers 104A, 104B, and 104C, each receiving an analog input signal 102 (which may be generated by a MEMS device, not shown in FIG. 1B). Each individual amplifier 104A, 104B, and 104C has a linear gain until it saturates for a given (increasing) maximum amplitude input signal. While three individual amplifiers are shown in FIG. 1B, any number greater than or equal to two can be used. The individual amplifiers gains are shown as a composite transfer function 114 showing the saturation occurring at different input voltage values. Each amplifier input is coupled to a corresponding input of a summing circuit 105. The summing circuit 105 provides a more accurate piece-wise linear logarithmic transfer function 116, wherein the accuracy of the logarithmic transfer function is determined by the number of individual amplifiers 104A, 104B, and 104C used. Analog-to-digital converter (ADC) 106 has an input coupled to the output of the summing circuit 105 to generate a digital representation of the logarithmically compressed analog signal on digital bus 107. The digital anti-logarithmic component 108 comprises an output bus 109 that provides a linearized digital signal by applying an anti-logarithmic transfer function 118 to the digital logarithmic signal received on digital bus 107. In FIG. 1B, it can be seen the signal compression is performed in the analog domain using the "quantized" approach described above, and the signal decompression is performed in the digital domain. Switched capacitor and continuous-time implementations of the logarithmic amplifier system 100B are described in further detail below.

FIG. 2 is a schematic diagram of a switched capacitor circuit 200 for implementing the quantized PGA and summing circuit shown in FIG. 1B, according to an embodiment. A composite PGA 202 includes a first amplifier 208 and a second amplifier 210. Amplifier 208 and amplifier 210 have different gain values and therefore saturate at different input voltages, as will be explained in greater detail below. The inputs of amplifiers 208 and 210 are coupled together at input node 206, for receiving an analog input from a MEMS device (not shown in FIG. 2). A switched capacitor summing circuit 204 includes a first switched capacitor C1 and a second switched capacitor C2. The value of each of the capacitors is one half of a total capacitance (C/2). While only two individual amplifiers and two switched capacitors are shown in FIG. 2, any number greater than two may be used in embodiments.

Capacitor C1 is coupled between nodes 212 and 214. Node 212 is selectively coupled to the output of first amplifier 208 through switch S2. Switch S2 is controlled by a first switching signal having a first phase $\Phi_1$. Node 214 is selectively coupled to summing node 224 through switch S3. Switch S3 is controlled by a second switching signal having a second phase $\Phi_2$. The phase of the first and second switching signals are non-overlapping in an embodiment. Nodes 212 and 214 are selectively coupled to ground and to node 216 through the action of switches S1, S4, and S5. Switches S1 and S5 are controlled by the first switching signal, and switch S4 is controlled by the second switching signal. The signals A, $\overline{A}$, B, and $\overline{B}$ are used to ground the inputs to the capacitors and to disconnect the corresponding amplifiers (for calibration purposes), in an embodiment.

Capacitor C2 is coupled between nodes 218 and 220. Node 218 is selectively coupled to the output of second amplifier 210 through switch S7. Switch S7 is controlled by the first switching signal having the first phase $\Phi_1$. Node 220 is selectively coupled to summing node 224 through switch S8. Switch S8 is controlled by the second switching signal having the second phase $\Phi_2$. The phase of the first and second switching signals are non-overlapping in an embodiment. Nodes 218 and 220 are selectively coupled to ground and to node 222 through the action of switches S6, S9, and S10. Switches S6 and S10 are controlled by the first switching signal, and switch S9 is controlled by the second switching signal.

In operation, the output voltages of amplifiers 208 and 210 are converted to charge by the action of summing circuit 204, and the charge is summed at summing node 204. The summed charge is then integrated by an integrator including differential operational amplifier 232 and integrating capacitor C3. Capacitor C3 is coupled between the inverting input of differential operational amplifier 232 at summing node 224 and the output of the differential operational amplifier 232 at node 226. The voltage at node 226 is selectively coupled to output node 228 by the action of switch S11, which is controlled by the first switching signal.

In FIG. 2 a single-ended output node 228 is shown, but input node 230 of differential amplifier 232, and inverting output node 234 of differential amplifier 232 can also be used to provide a fully differential output at output node 228 and inverting output node 234. In FIG. 2, node 216 and node 218 are analog ground, whereas the other ground connections are digital ground nodes.

Figure 3:
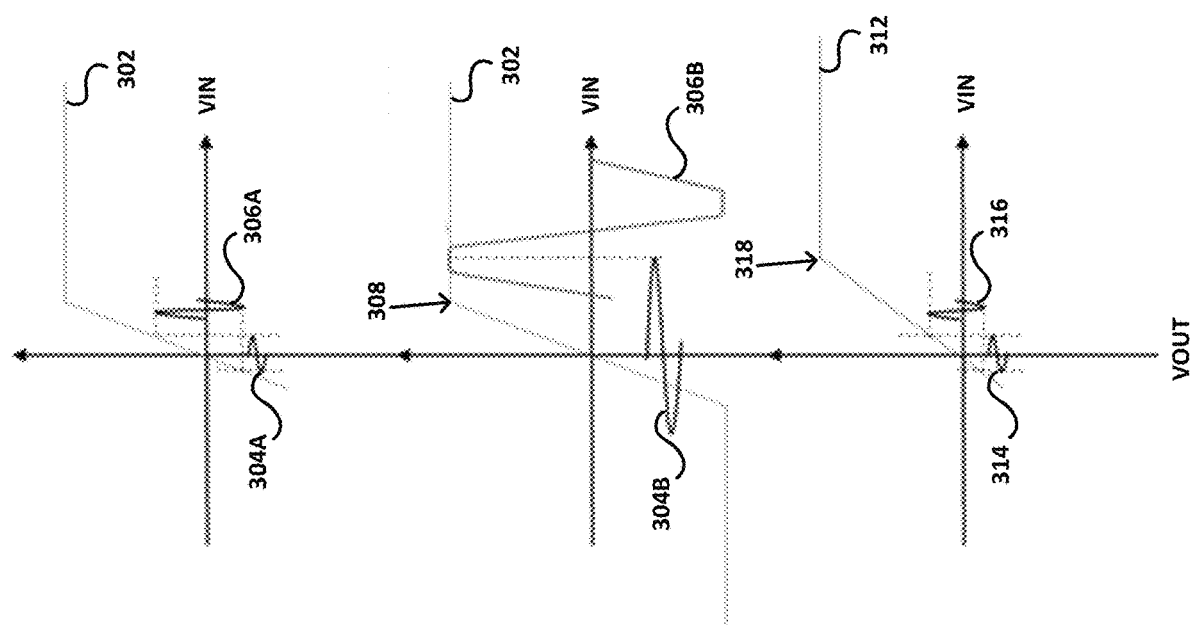
FIG. 3 is a gain plot of individual amplifiers used in the quantized PGA shown in FIG. 1B.

FIG. 3 is a gain plot of individual amplifiers used in the quantized PGA shown in FIG. 1B. FIG. 3 shows the values that are obtained in the digital domain for constructing an accurate piecewise linear transfer function approximating a logarithmic transfer function. The piecewise linear approach, with at least two different well-defined gains (due to strong feedback in the PGAs) and the saturation level will provide three points for constructing the logarithmic transfer function. An even more accurate logarithmic transfer function can be constructed by using additional individual amplifiers (PGAs). Temperature variations and process variations are taken into account when generating the piecewise linear transfer function, in some embodiments. For example, recalibration can be performed over temperature by sensing the temperature periodically and then resuming the normal operational mode. Similarly, the calibration process will take into account the intrinsic device variations individually.

FIG. 3 thus shows the input voltages and output voltages for two individual amplifiers having different gains. The lower gain amplifier, with a gain 312, has an input voltage 314 and an output voltage 316 in an example. The transfer function saturates at point 318. The higher gain amplifier, with a gain 302, has an input voltage 304A/304B and a corresponding output voltage 306A/306B in an example. The transfer function saturates at point 308. It is important to note that the saturation points of the two amplifiers occur at different input voltages, even though the output saturation voltage may be the same in some embodiments.

Figure 4:
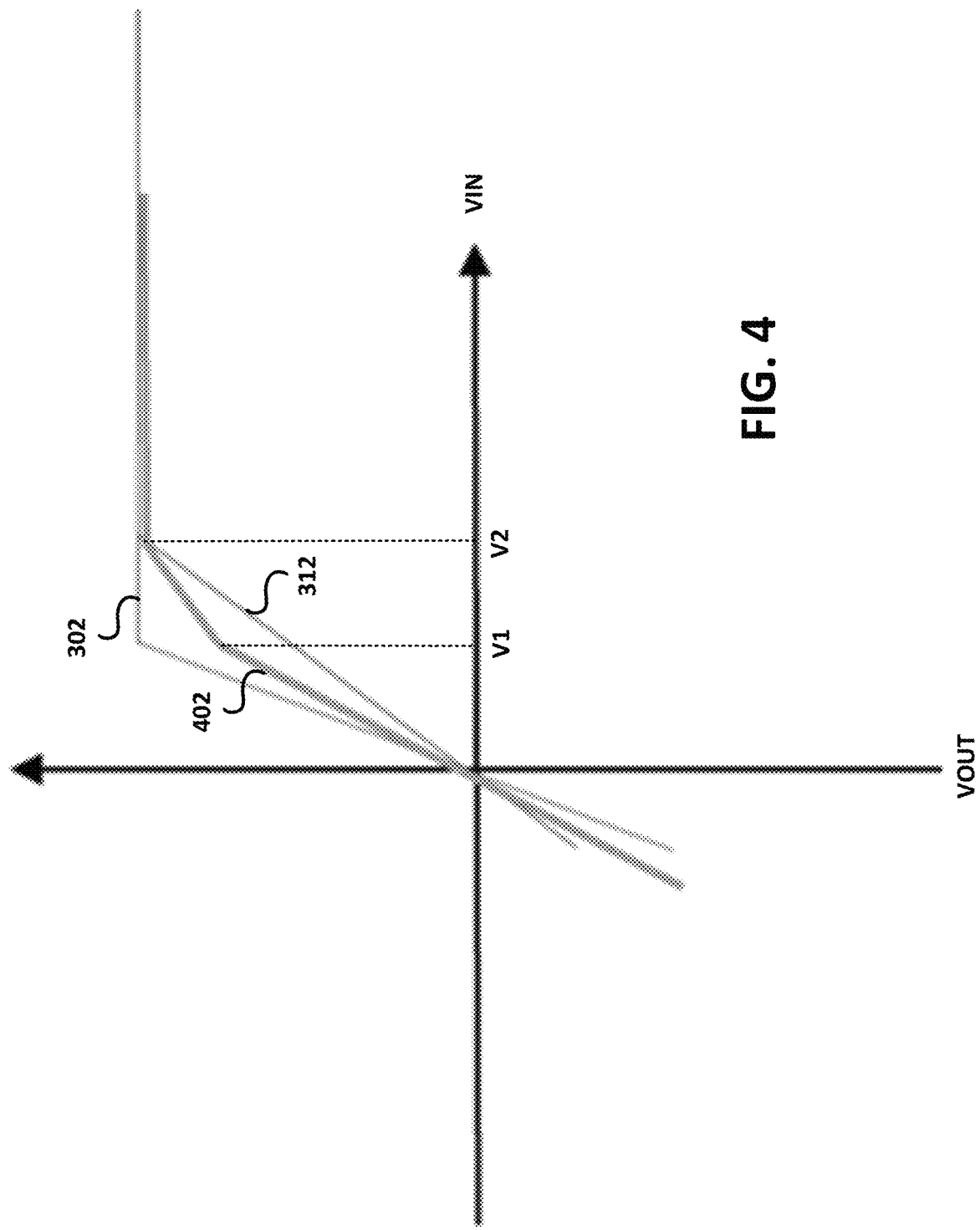
FIG. 4 is a gain plot of a piecewise linear transfer function provided by the quantized PGA and summing circuit shown in FIG. 1B.

FIG. 4 is a gain plot of a piecewise linear transfer function (approximating a logarithmic transfer function) provided by the quantized PGA and summing circuit shown in FIG. 1B, which shows the combined gain (individual gains 302 and 312 from the quantized PGA) and the non-linear transfer function (piecewise linear transfer function 402 from the summing circuit).

Figure 5:
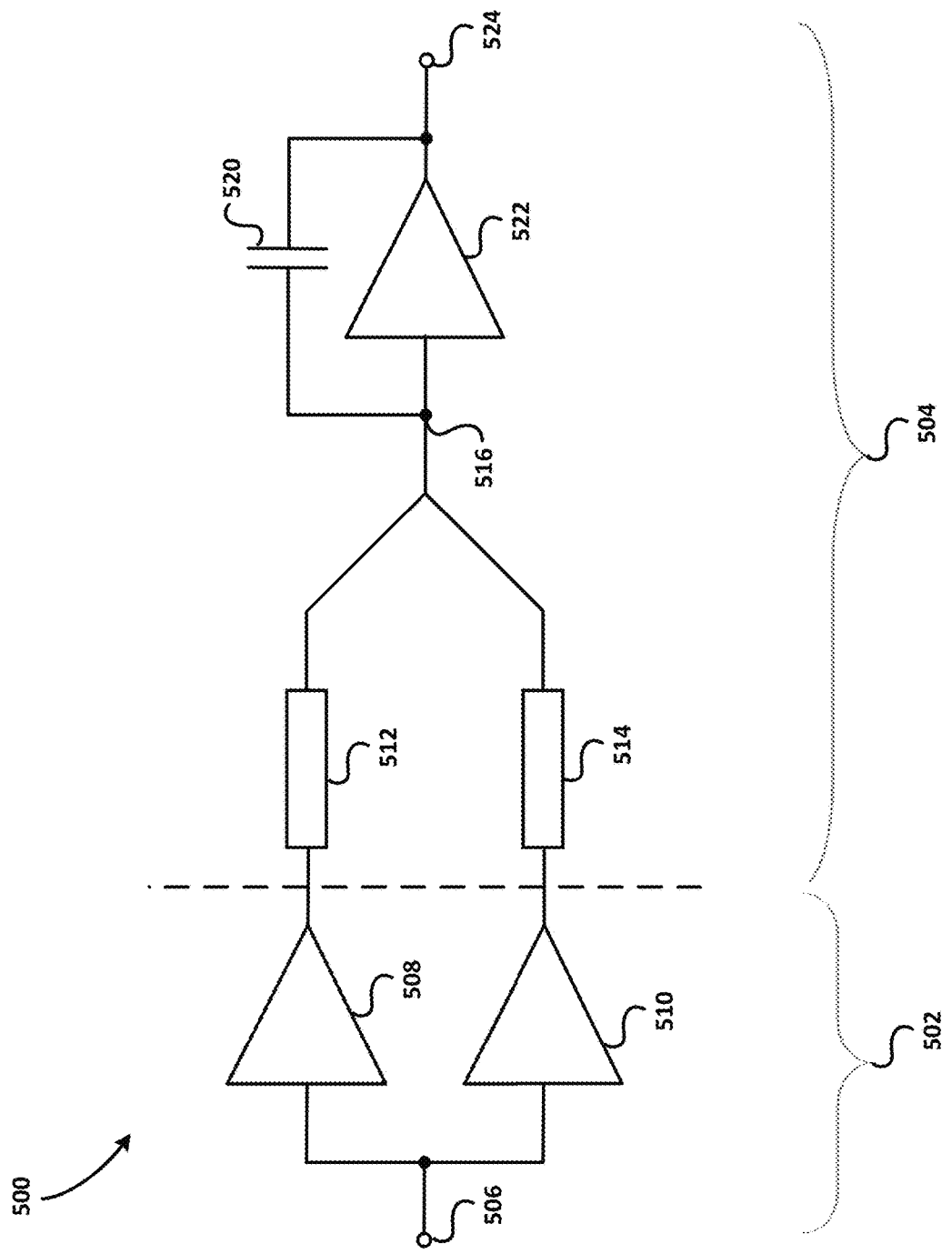
FIG. 5 is a schematic diagram of a continuous-time resistor circuit for implementing the quantized PGA and summing circuit shown in FIG. 1B, according to an embodiment.

FIG. 5 is a schematic diagram of a continuous-time resistor circuit 500 for implementing a quantized PGA 502 and a summing circuit 504 corresponding to the quantized PGA and summing circuit shown in FIG. 1B, according to an embodiment. Continuous-time resistor circuit includes individual amplifier 508 and 510 having inputs coupled to input node 506. Individual amplifiers 508 and 510 have different gains, which can be programmable in an embodiment. The output of amplifier 508 is coupled to resistor 512, and the output of amplifier 510 is coupled to resistor 514. Resistors 512 and 514 are coupled together at node 516. The currents generated by the input voltage divided by resistor 512 and by the input voltage divided by resistor 514 are summed together at node 516. In an embodiment continuous-time resistor circuit 500 can comprise a temperature-compensated circuit. The summed current at node 516 is integrated by an integrator comprising operational amplifier 522 and integrating capacitor 520 to provide a piecewise linear function at output node 524. While only two amplifiers and two resistors are shown in FIG. 5, it will be appreciated by those skilled in the art that more than two amplifiers and two resistors can be used. In some embodiments, resistors 512 and 514 can be replaced by transconductance components. An implementation of a quantized PGA and summing circuit having four amplifiers is described in further detail below.

Figure 6A:
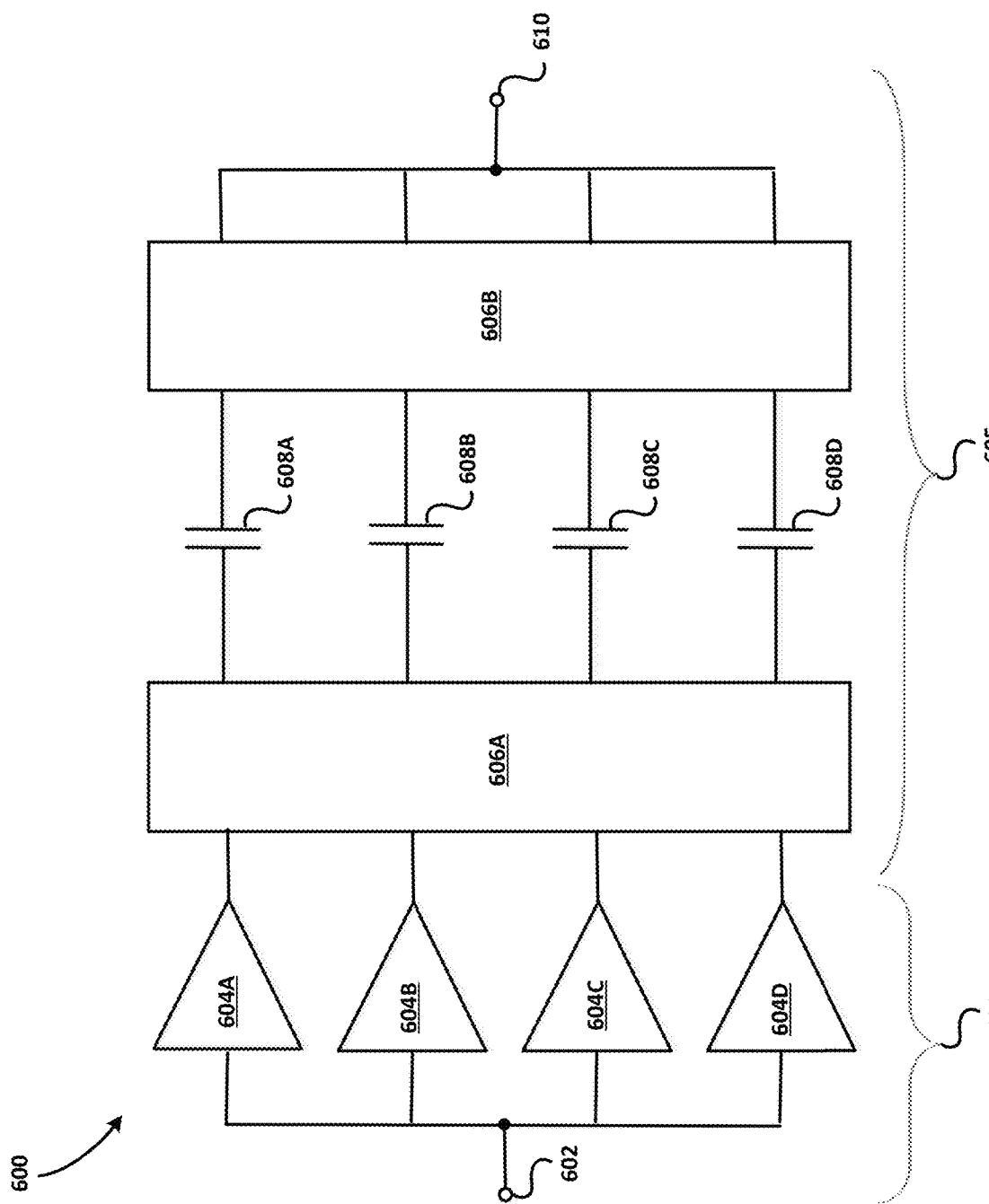
FIG. 6A is a schematic diagram of a quantized PGA and summing circuit including four individual amplifiers and four switched capacitors, according to an embodiment.

FIG. 6A is a schematic diagram of a circuit 600 including a quantized PGA 603 and summing circuit 605 including four individual amplifiers 604A, 604B, 604C, and 604D, and four switched capacitors 608A, 608B, 608C, and 608D, according to an embodiment. The inputs of individual amplifiers 604A, 604B, 604C, and 604D are coupled to input node 602 for receiving an analog input signal. The outputs of individual amplifiers 604A, 604B, 604C, and 604D are coupled to a first switch matrix 606A. The first switch matrix 606A was previously described with respect to a two-channel switched capacitor summing circuit 204 including switches S1, S2, S4, S6, S7, and S9 shown in FIG. 2. Four capacitors 608A, 608B, 608C, and 608D are coupled between the first switch matrix 606A and a second switch matrix 606B. The second switch matrix 606B was previously described with respect to the two-channel switched capacitor summing circuit 204 including switches S3, S5, S8, and S10 shown in FIG. 2. The outputs of the second switch matrix 606B are couple to an output node 610 for providing a piecewise linear transfer function.

Figure 6B:
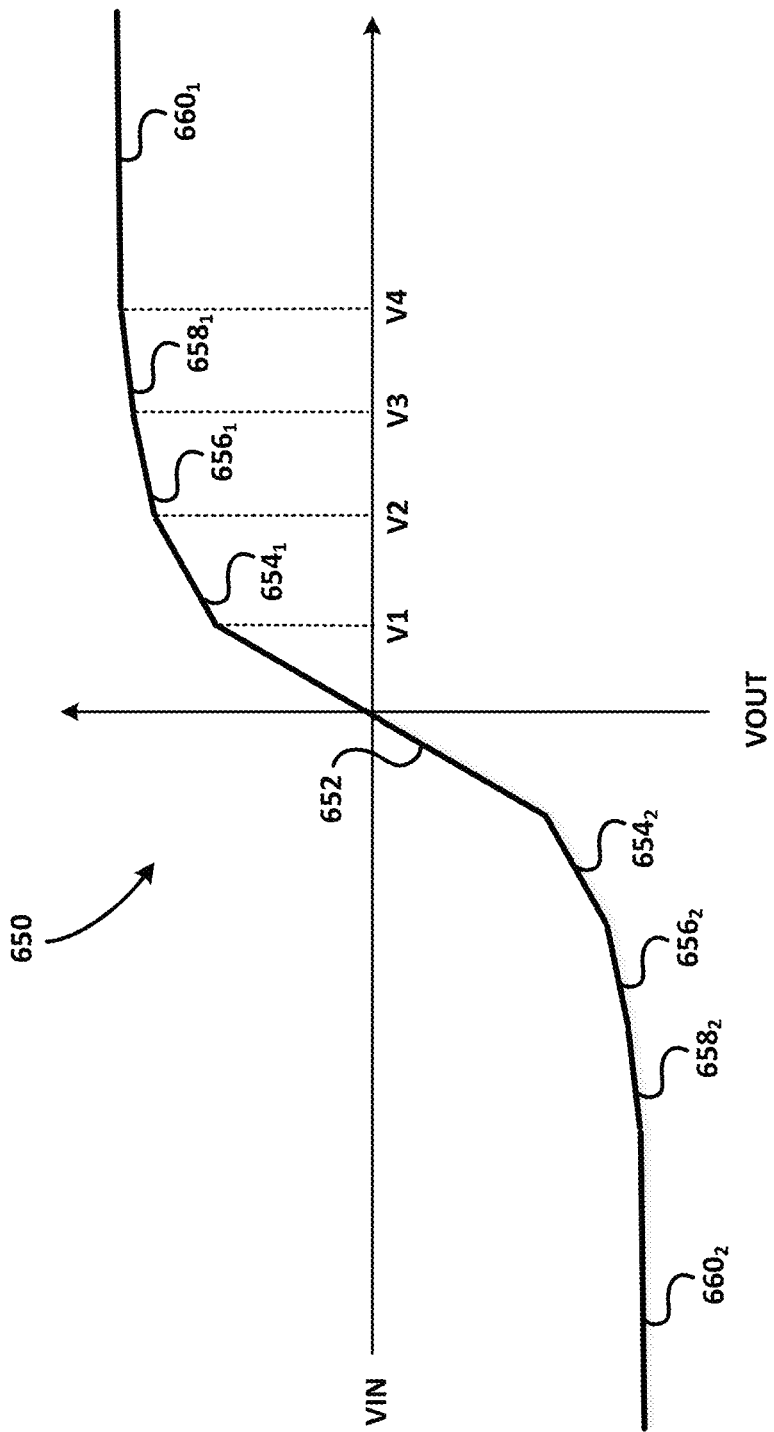
FIG. 6B is a plot of a piecewise linear transfer function provided by the quantized PGA and summing circuit of FIG. 6A.

FIG. 6B is a plot of the piecewise linear transfer function 650 provided by circuit 600 including the quantized PGA 603 and summing circuit 605 of FIG. 6A. For positive input voltages, piecewise linear transfer function 650 includes a first linear portion 652 between zero volts and voltage V1, a second linear portion $654_1$ between voltages V1 and V2, a third linear portion $656_1$ between voltages V2 and V3, a fourth linear portion $658_1$ between voltages V3 and V4, and a fifth linear portion $660_1$ for voltages greater than voltage V4. The piecewise portions are generated from the successive saturation of the individual amplifiers in the quantized PGA as previously discussed. For negative voltages, the piecewise linear transfer function 650 includes corresponding linear portions 652, $654_2$, $656_2$, $658_2$, and $660_2$. It can be seen from an inspection of FIG. 6B is that a circuit with four amplifiers provides a more accurate transfer function that a circuit with two amplifiers as is shown in FIG. 4. The use of additional amplifiers, as well as additional capacitors or resistors, will provide an even more accurate logarithmic transfer function leading to lower distortion.

Figure 7A:
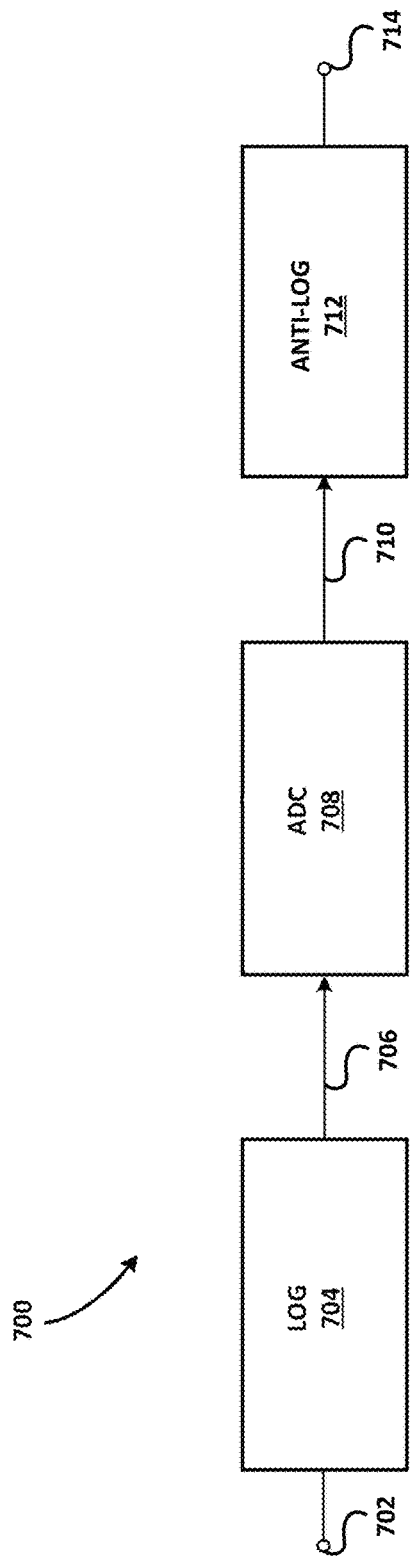
FIG. 7A is a block diagram of a logarithmic amplifier system, including a logarithmic amplifier, an ADC, and an anti-logarithmic component, according to an embodiment.

FIG. 7A is a block diagram of a logarithmic amplifier system 700, including a logarithmic amplifier 704, an ADC 708, and an anti-logarithmic component 712, according to an embodiment. Logarithmic amplifier 704 is coupled between an input node 702 and node 706, ADC is coupled between node 706 and node 710, and anti-logarithmic component 712 is coupled between nodes 710 and 714. Aspects of the logarithmic amplifier system 700 have been previously discussed, wherein logarithmic amplifier 704 can include a quantized PGA and a summing circuit, and wherein ADC can comprise a sigma-delta ADC. Anti-logarithmic component can comprise a plurality of digital sub-components, which are described in further detail below with respect to FIGS. 7B and 7C.

Figure 7B:
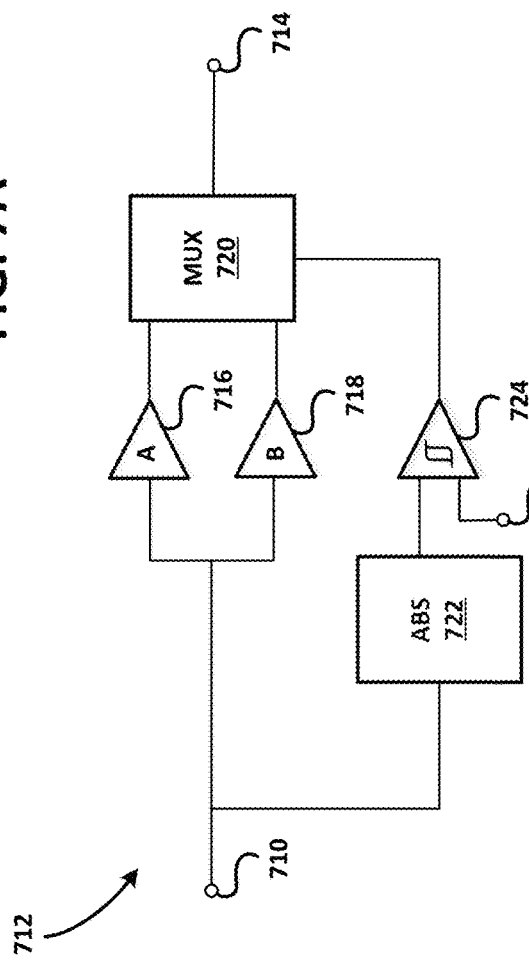
FIG. 7B is a schematic diagram of an implementation of the anti-logarithmic component according to FIG. 7A, according to an embodiment.

FIG. 7B is a schematic diagram of an implementation of the anti-logarithmic component 712 according to FIG. 7A, according to an embodiment. Anti-logarithmic component comprises a first gain component 716 and a second gain component 718 having inputs coupled to node 710. First gain component 712 has a first gain "A", and second gain component has a second gain "B" that is different from the first gain. The output of first gain component 716 is coupled to a first input of multiplexer 720, and the output of second gain component 718 is coupled to a second input of multiplexer 720. The output of multiplexer 720 is coupled to node 714. An absolute value component 722 has an input coupled to node 710, and an output for generating the absolute value of the digital input voltage. The output of the absolute value component 722 is coupled to a first input of comparator 724. A second input of comparator 724 is coupled to a reference node 726 for receiving a "trip point" reference voltage that is described in further detail below with respect to FIG. 7C. The output of comparator 724 is coupled to the control input of multiplexer 720. While anti-logarithmic component 712 is specifically designed for use with the two amplifier, two capacitor embodiment shown in FIG. 2. However, anti-logarithmic component 712 can be adapted to other embodiments by the use additional gain components, for example.

Figure 7C:
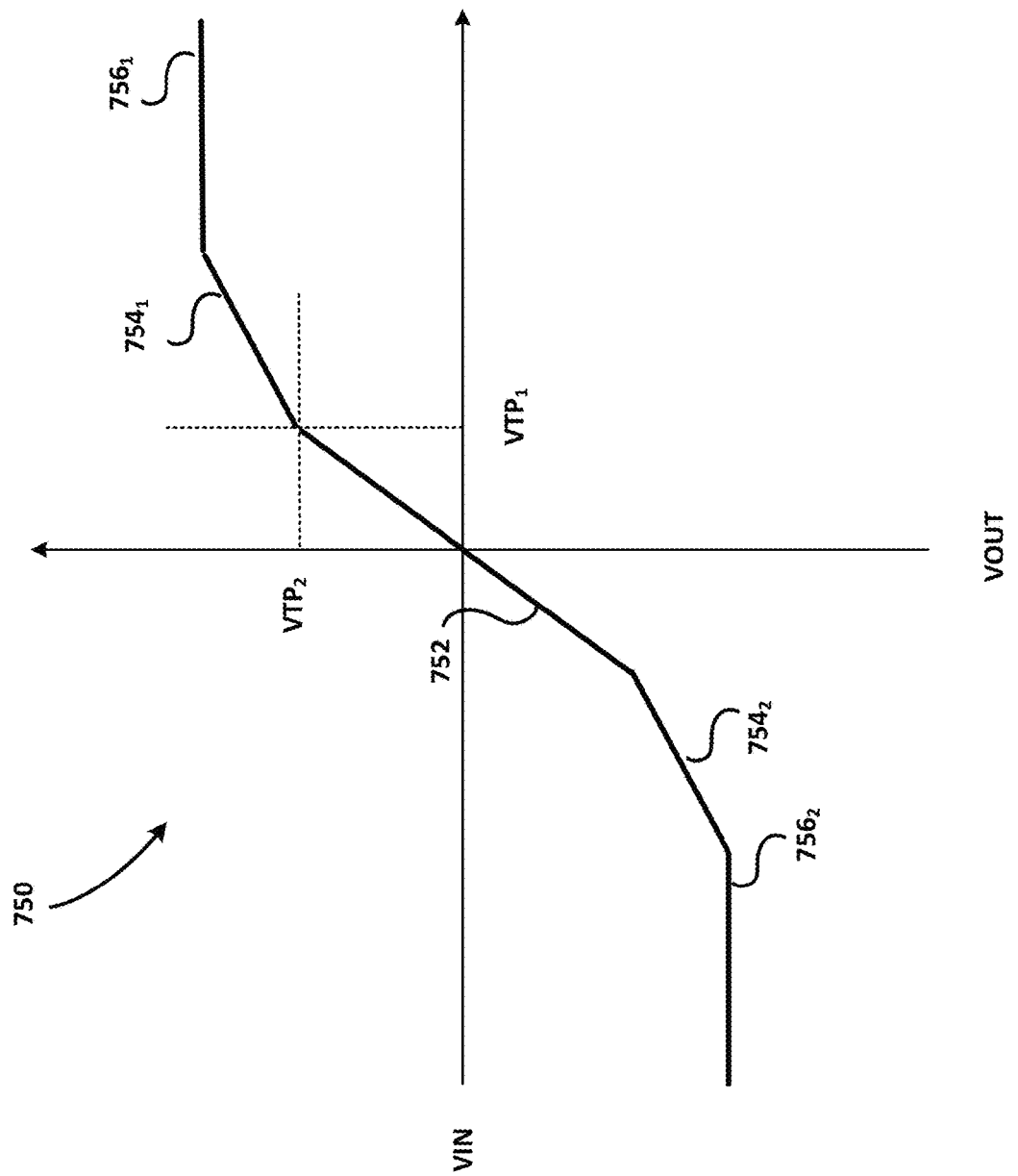
FIG. 7C is a plot of a piecewise linear transfer function associated with the logarithmic amplifier system of FIG. 7A, according to an embodiment.

FIG. 7C is a plot of a piecewise linear transfer function 750 associated with the logarithmic amplifier system of FIG. 7A, according to an embodiment. In the example of FIG. 7C a logarithmic amplifier including two individual amplifiers is used. There the piecewise linear transfer function 750 includes linear portions 752, 754$_1$, 756$_1$, 754$_2$, and 756$_2$. In operation, anti-logarithmic component 712 selects between gains "A" and "B" at a trip point defined by input voltage trip point VTP1 and output voltage trip point VTP2. A lower gain is applied by one of the gain components at input voltages below the trip point, and applies a larger gain by the other of the gain components at input voltages above the trip point. In this manner, a linearized transfer function is provided by the anti-logarithmic component 712 at node 714.

Figure 8:
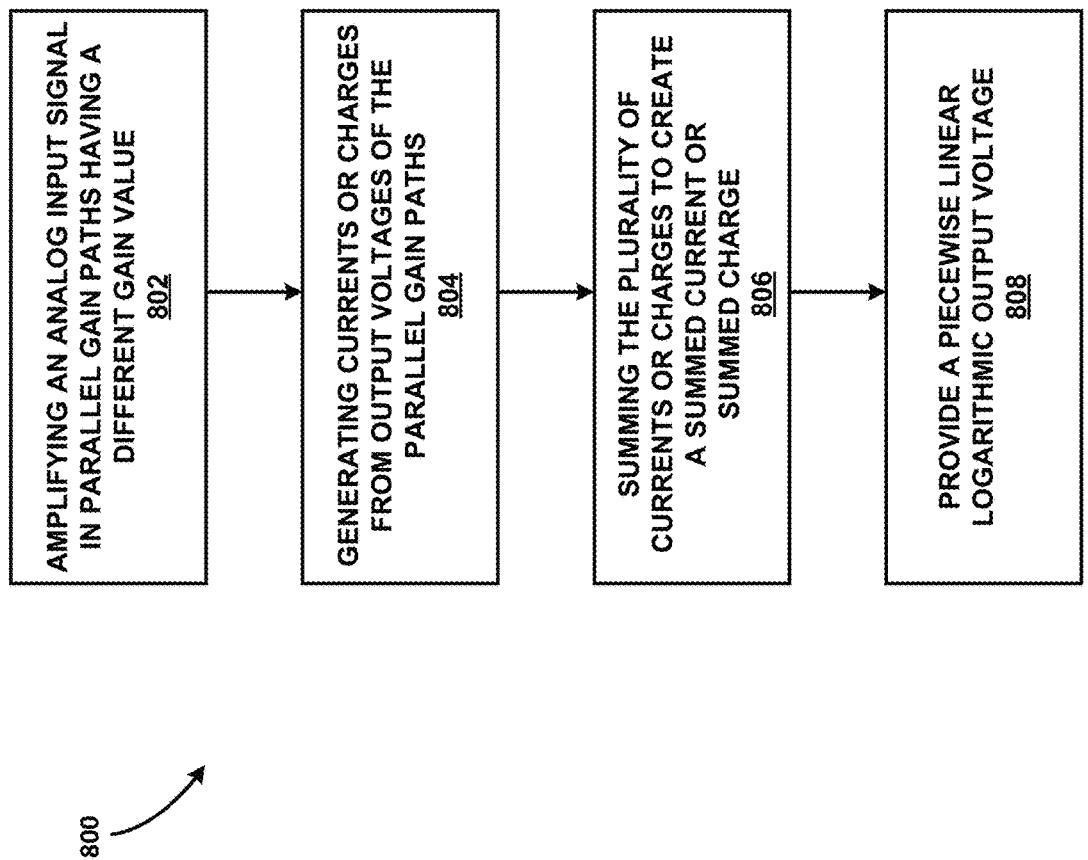
FIG. 8 is a flowchart of an embodiment method.

FIG. 8 is a flowchart of an embodiment method 800, which includes amplifying an analog input signal in a plurality of parallel gain paths, wherein each of the parallel gain paths comprises a different gain value at step 802; generating a plurality of currents or charges from a plurality of output voltages of the parallel gain paths at step 804; and providing a piecewise linear output voltage at step 808, which approximates a logarithmic output voltage.

Figure 9:
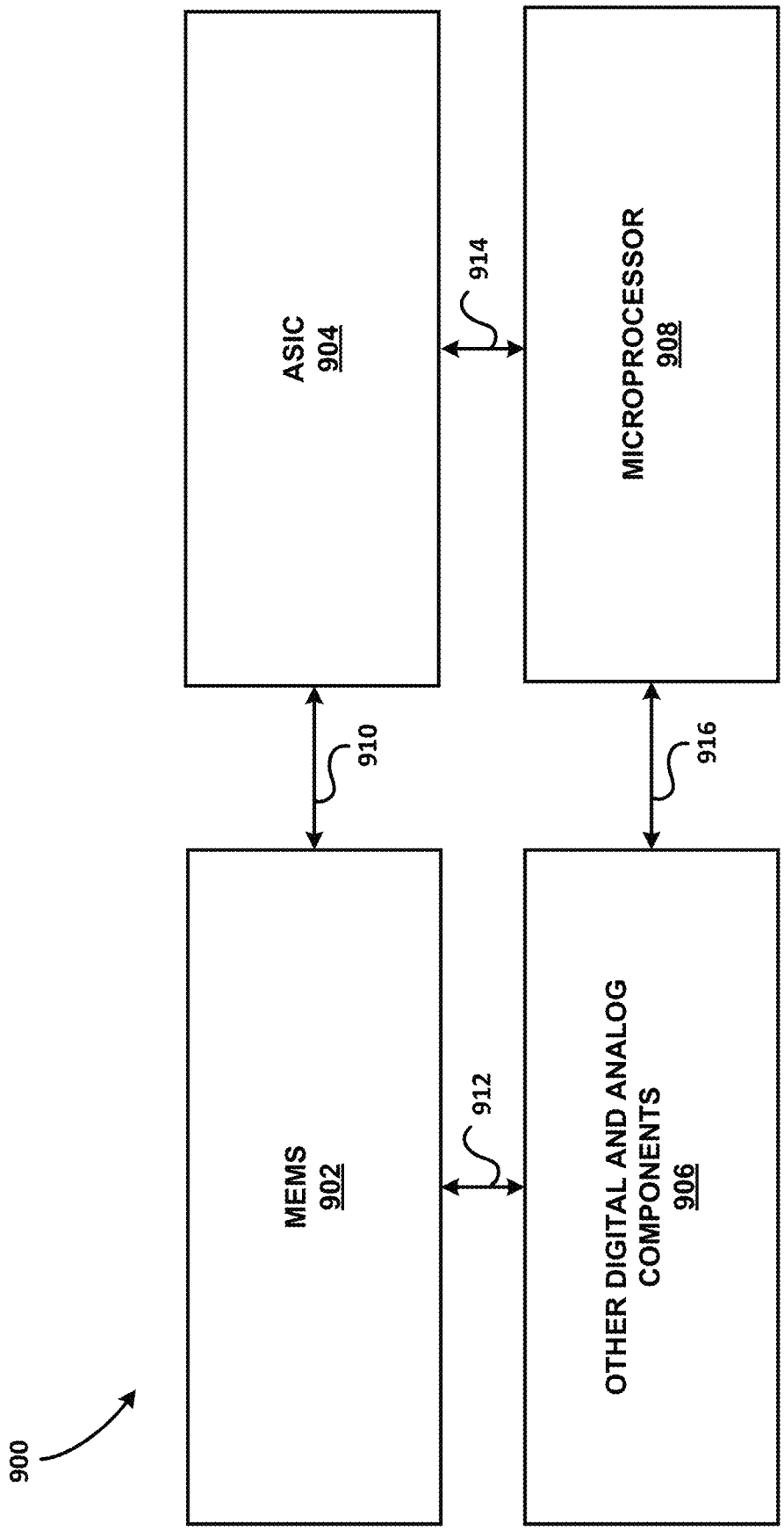
FIG. 9 is a block diagram of a digital microphone product, according to an embodiment.

FIG. 9 is a block diagram for a digital microphone product 900 including a logarithmic amplifier as described above. Digital microphone product 900 includes MEMS device 902 and ASIC 904. MEMS device can comprise a capacitive MEMS device that generates an analog voltage in response to received sound waves. ASIC 904 can comprise the logarithmic amplifier, ADC, and anti-logarithmic component, all previously described. The MEMS device 902 and ASIC 904 are in communication via bidirectional bus 910. MEMS device 902 and ASIC 904 can be packaged together to form a single digital product, such as a digital microphone. In some embodiments, digital microphone product 900 can also include other digital and analog components 906, such as additional filters, amplifiers, and other similar components. The other digital and analog components 906 can communicate with MEMS device 902 through bidirectional bus 912. In some embodiments, digital microphone product 900 can also include a microprocessor 908, which can communicate with ASIC 904 and the other digital and analog components 906 through bidirectional bus 914 and bidirectional bus 916. For example, microprocessor 908 can generate clock signals and receive data from ASIC 904. In other embodiments, microprocessor 908 can provide the functionality of digital or software components that would otherwise be resident on ASIC 904.

Example embodiments of the present invention are summarized here. Other embodiments can also be understood from the entirety of the specification and the claims filed herein.

Example 1. According to an embodiment, a logarithmic amplifier includes a plurality of programmable gain amplifiers each having a different gain, wherein an input of each of the plurality of programmable gain amplifiers is coupled to an input of the logarithmic amplifier; and a summing circuit having a plurality of inputs coupled to a corresponding output of each of the plurality of programmable gain amplifiers and an output coupled to an output of the logarithmic amplifier, wherein the summing circuit is configured for generating a logarithmic transfer function having a plurality of piecewise linear segments.

Example 2. The logarithmic amplifier of Example 1, wherein the summing circuit includes a switched capacitor circuit coupled to an integrator.

Example 3. The logarithmic amplifier of any of the above examples, wherein the switched capacitor circuit includes a plurality of switched capacitors each switched between a corresponding programmable gain amplifier output and a summing node of the summing circuit.

Example 4. The logarithmic amplifier of any of the above examples, wherein the summing circuit includes a resistor circuit.

Example 5. The logarithmic amplifier of any of the above examples, wherein the resistor circuit includes a plurality of resistors each coupled between a corresponding programmable gain amplifier output and a summing node of the summing circuit.

Example 6. The logarithmic amplifier of any of the above examples, wherein the summing circuit includes a transconductance circuit.

Example 7. According to an embodiment, a circuit includes a logarithmic amplifier including a plurality of programmable gain amplifiers, the logarithmic amplifier having an input for receiving an analog input voltage; an analog-to-digital converter ("ADC") having an input coupled to an output of the piecewise logarithmic amplifier; and a digital anti-logarithmic component coupled to an output of the ADC, wherein an output of the digital anti-logarithmic component provides a linearized digital signal corresponding to the analog input voltage.

Example 8. The circuit of Example 7, wherein the logarithmic amplifier includes a switched capacitor logarithmic amplifier.

Example 9. The circuit of any of the above examples, wherein the logarithmic amplifier includes a continuous time logarithmic amplifier.

Example 10. The circuit of any of the above examples, wherein the ADC includes a sigma-delta ADC.

Example 11. The circuit of any of the above examples, wherein a size of the ADC is inversely proportional to a number of the programmable gain amplifiers in the logarithmic amplifier.

Example 12. The circuit of any of the above examples, wherein the digital anti-logarithmic component includes a first gain path and a second gain path coupled to an input of the digital anti-logarithmic component; and a multiplexer coupled to the first gain path and the second gain path, and an output forming an output of the digital anti-logarithmic component.

Example 13. The circuit of any of the above examples, wherein the digital anti-logarithmic component further includes an absolute value component coupled to the input of the digital anti-logarithmic component; and a comparator having a first input coupled to the absolute value component, a second input for receiving a reference voltage, and an output coupled to the output of the digital anti-logarithmic component.

Example 14. The circuit of any of the above examples, wherein the analog input voltage includes an analog voltage generated by a MEMS device.

Example 15. According to an embodiment, a method includes amplifying an analog input signal in a plurality of parallel gain paths, wherein each of the parallel gain paths includes a different gain value; generating a plurality of currents or charges from a plurality of output voltages of the parallel gain paths; and summing the plurality of currents or charges to provide a linear logarithmic output voltage.

Example 16. The method of Example 15, wherein each of the parallel gain paths saturate at a different analog input signal value.

Example 17. The method of any of the above examples, wherein generating the plurality of currents includes generating the plurality of currents in a continuous time resistor circuit or a continuous time transconductance circuit.

Example 18. The method of any of the above examples, wherein generating the plurality of charges includes generating the plurality of charges in a switched capacitor circuit.

Example 19. The method of any of the above examples, further including converting the logarithmic output voltage into a digital signal.

Example 20. The method of any of the above examples, further including using an anti-log transfer function component to generate a linearized digital signal output signal corresponding to the analog input signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A logarithmic amplifier comprising:
a plurality of programmable gain amplifiers each having a different gain, wherein an input of each of the plurality of programmable gain amplifiers is coupled to an input of the logarithmic amplifier; and
a summing circuit having a plurality of inputs coupled to a corresponding output of each of the plurality of programmable gain amplifiers and an output coupled to an output of the logarithmic amplifier, wherein the summing circuit is configured for generating a plurality of piecewise linear segments, wherein the summing circuit comprises a switched capacitor circuit.

2. The logarithmic amplifier of claim 1, wherein the switched capacitor circuit comprises a plurality of switched capacitors each switched between a corresponding programmable gain amplifier output and a summing node of the summing circuit.

3. The logarithmic amplifier of claim 1, wherein an input of the summing circuit comprises a transconductance circuit.

4. A circuit comprising:
a piecewise linear amplifier comprising a plurality of programmable gain amplifiers, the piecewise linear amplifier having an input for receiving an analog input voltage;
an analog-to-digital converter (ADC) having an input coupled to an output of the piecewise linear amplifier; and
a digital anti-logarithmic component coupled to an output of the ADC, wherein an output of the digital anti-logarithmic component provides a linearized digital signal corresponding to the analog input voltage.

5. The circuit of claim 4, wherein the piecewise linear amplifier comprises a switched capacitor piecewise linear amplifier.

6. The circuit of claim 4, wherein the piecewise linear amplifier comprises a continuous time piecewise linear amplifier.

7. The circuit of claim 4, wherein the ADC comprises a sigma-delta ADC.

8. The circuit of claim 4, wherein a size of the ADC is inversely proportional to a number of the programmable gain amplifiers in the piecewise linear amplifier.

9. The circuit of claim 4, wherein the digital anti-logarithmic component comprises:
a first gain path and a second gain path coupled to an input of the digital anti-logarithmic component; and
a multiplexer coupled to the first gain path and the second gain path, and an output forming an output of the digital anti-logarithmic component.

10. The circuit of claim 9, wherein the digital anti-logarithmic component further comprises:
an absolute value component coupled to the input of the digital anti-logarithmic component; and
a comparator having a first input coupled to the absolute value component, a second input for receiving a reference voltage, and an output coupled to the output of the digital anti-logarithmic component.

11. The circuit of claim 4, wherein the analog input voltage comprises an analog voltage generated by a MEMS device.

12. A method comprising:
amplifying an analog input signal in a plurality of parallel gain paths, wherein each of the parallel gain paths comprises a different gain value;
generating a plurality of charges from a plurality of output voltages of the parallel gain paths, wherein generating the plurality of charges comprises generating the plurality of charges in a switched capacitor circuit; and
summing the plurality of currents or charges to provide a piecewise linear output voltage approximating a logarithmic output voltage.

13. The method of claim 12, wherein each of the parallel gain paths saturates at a different analog input signal value.

14. The method of claim 12, further comprising converting the piecewise linear output voltage into a digital signal.

15. The method of claim 14, further comprising using an anti-log transfer function component to generate a linearized digital signal output signal corresponding to the analog input signal.

16. A circuit comprising:
a plurality of programmable gain amplifiers each having a different gain, wherein an input of each of the plurality of programmable gain amplifiers is coupled to an input of the circuit;
a summing circuit having a plurality of inputs coupled to a corresponding output of each of the plurality of programmable gain amplifiers and an output coupled to an output of the circuit, wherein the summing circuit is configured for generating a plurality of piecewise linear segments; and
an anti-logarithmic component coupled to an output of the summing circuit, wherein an output of the anti-logarithmic component provides a linearized signal corresponding to an analog input signal at the input of the circuit.

17. The circuit of claim 16, further comprising an analog-to-digital converter (ADC) coupled between the summing circuit and the anti-logarithmic component, wherein the anti-logarithmic component comprises a digital circuit, and the linearized signal comprises a digital linearized signal.

18. The circuit of claim 16, wherein the summing circuit comprises a switched capacitor circuit.

19. The circuit of claim 16, wherein the summing circuit comprises a resistor circuit.

20. The circuit of claim 19, wherein the resistor circuit comprises a plurality of resistors each coupled between a corresponding programmable gain amplifier output and a summing node of the summing circuit.

* * * * *

UNITED STATES PATENT AND TRADEMARK OFFICE
CERTIFICATE OF CORRECTION

| | | |
|---|---|---|
| PATENT NO. | : 12,368,421 B2 | Page 1 of 1 |
| APPLICATION NO. | : 17/660120 | |
| DATED | : July 22, 2025 | |
| INVENTOR(S) | : Ceballos et al. | |

It is certified that error appears in the above-identified patent and that said Letters Patent is hereby corrected as shown below:

In the Claims

In Column 9, in Claim 3, Lines 46-47, after "wherein" delete "an input of".

In Column 10, in Claim 12, Line 30, after "plurality of" delete "currents or".

Signed and Sealed this
Thirtieth Day of September, 2025

John A. Squires
*Director of the United States Patent and Trademark Office*